United States Patent

Nechansky et al.

Patent Number: 5,873,402
Date of Patent: Feb. 23, 1999

[54] METHOD OF MAKING A CASING FOR RECEIVING ELECTRONIC COMPONENTS OR SWITCHING CIRCUITS

[75] Inventors: Helmut Nechansky; Theodor Schmitt, both of Vienna, Austria

[73] Assignee: Electrovac, Fabrikation Elektrotechnischer Spezialartikel Gesellschaft M.B.H., Klosterneuburg, Austria

[21] Appl. No.: 632,792

[22] Filed: Apr. 17, 1996

[30] Foreign Application Priority Data

Apr. 18, 1995 [AT] Austria ..................... 661/95

[51] Int. Cl.[6] ................. B22D 19/00; B22D 17/00
[52] U.S. Cl. ................ 164/98; 164/113; 164/97
[58] Field of Search .................. 164/98, 97, 113

[56] References Cited

U.S. PATENT DOCUMENTS

| | | |
|---|---|---|
| 5,198,885 | 3/1993 | Shawki . |
| 5,371,043 | 12/1994 | Anderson et al. ............ 164/98 |
| 5,480,727 | 1/1996 | Romero et al. ............ 164/97 |
| 5,526,867 | 6/1996 | Keck et al. ............ 164/98 |
| 5,657,811 | 8/1997 | Cook ............ 164/98 |
| 5,662,157 | 9/1997 | Cook ............ 164/97 |

FOREIGN PATENT DOCUMENTS

| | | |
|---|---|---|
| 0 110 997 A | 6/1984 | European Pat. Off. . |
| 2 718 319 A | 10/1995 | France . |
| 41 00 145 A | 7/1991 | Germany . |
| 2 173 036 | 10/1986 | United Kingdom . |
| WO 91 13462 A | 9/1991 | WIPO . |

OTHER PUBLICATIONS

Patent Abstracts of Japan vol. 012, No. 077 (E–589), Mar. 10, 1988 & JP 62 217641 A (Kyocera Corp), Sep. 25, 1987, *abstract*.

Patent Abstracts of Japan vol. 010, No. 332 (E–453), Nov. 12, 1986 & JP 61 137350 A (Nec Corp), Jun. 25, 1986, *abstract*.

*Primary Examiner*—Patrick Ryan
*Assistant Examiner*—I.-H. Lin
*Attorney, Agent, or Firm*—Henry M. Feiereisen

[57] ABSTRACT

A process of making a casing having at least one open end and formed with electric conducting passages and connections for electronic components or switching circuits, includes the following steps: preparing a formed body, made of ceramics, glass, glass-ceramics, metal or silicon carbide, with passageways in form of bores and/or indentations, placing the formed body in a mold and pouring liquid metal in the mold to surround the formed body, thereby filling the first passageways, and removing metal from the formed body to leave metal only in the first passageways.

29 Claims, 6 Drawing Sheets

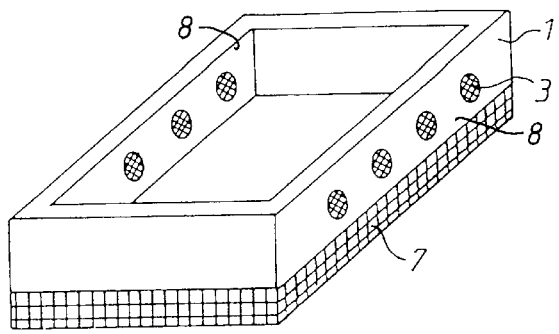
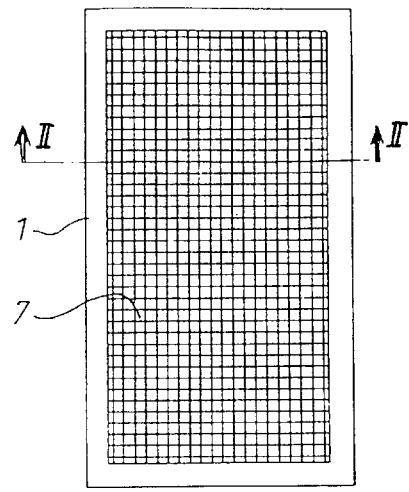
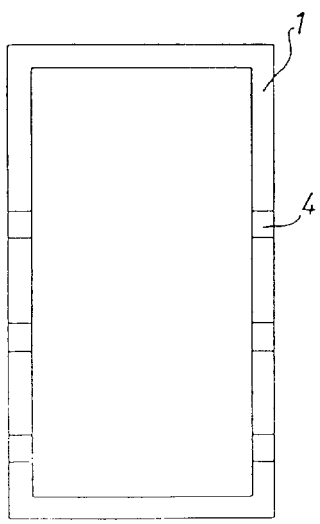
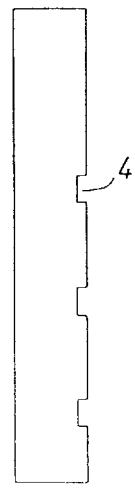
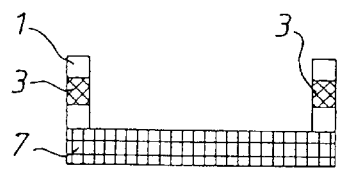
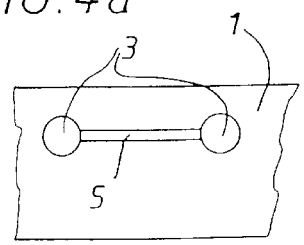
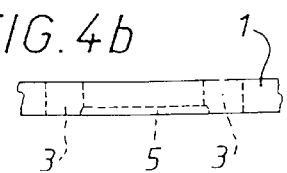

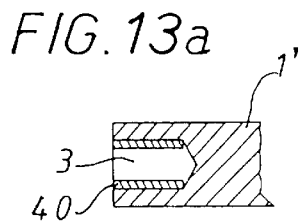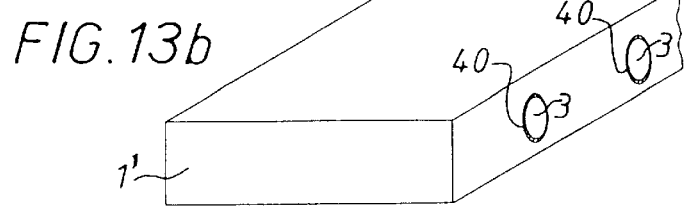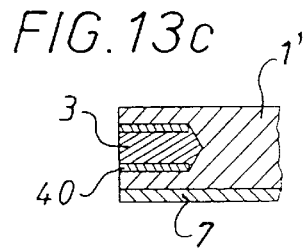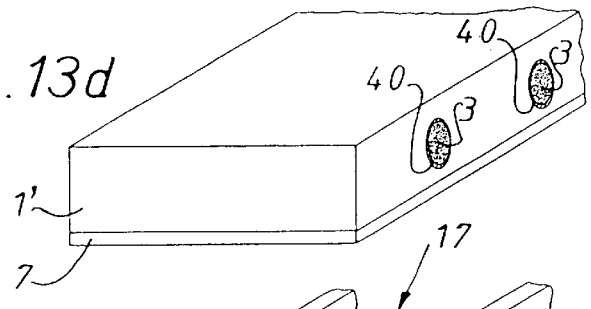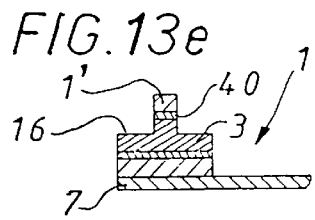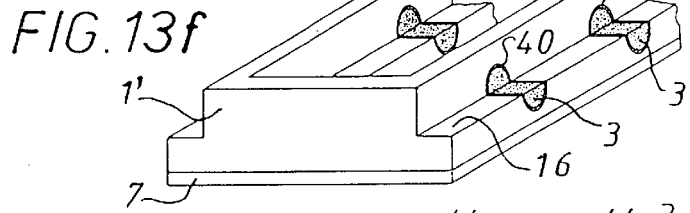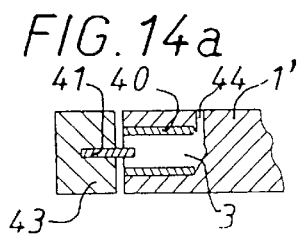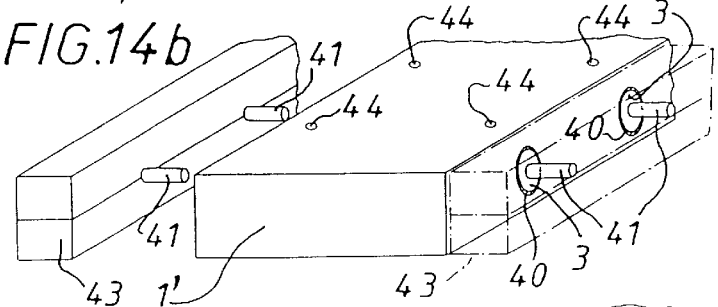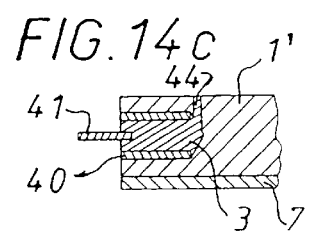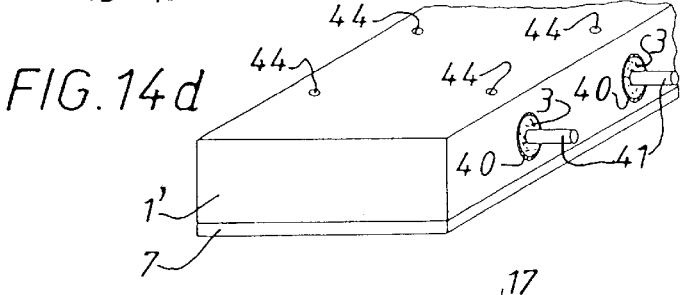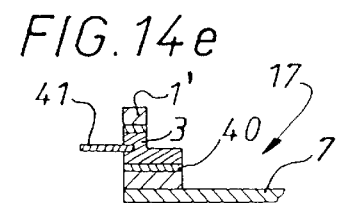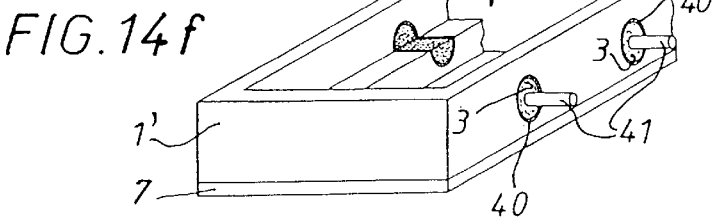

METHOD OF MAKING A CASING FOR RECEIVING ELECTRONIC COMPONENTS OR SWITCHING CIRCUITS

BACKGROUND OF THE INVENTION

The present invention refers to a method of making a casing of a type having at least one open end and formed with electrically conducting passages for connection of electronic components or switching circuits.

Casings of this type are generally known in the electronic field and produced on a large scale. However, the formation of contacts projecting outwards from the casing interior has proven difficult and can be effected only by complicated operations that greatly increase the manufacturing costs for such casings. Moreover, conventional casings exhibit a heat conductivity which is relatively low so that the required cooling effect can be attained only by greatly expanding the dimensions of the casing which significantly exceed the actual space required for the switching circuit.

SUMMARY OF THE INVENTION

It is an object of the present invention to provide an improved method of making a casing for receiving electronic components or switching circuits, obviating the aforestated drawbacks.

In particular, it is an object of the present invention to provide an improved method of making a casing that allows all contacts to be produced in a single process step.

It is still another object of the present invention to provide an improved casing that is simple to produce and exhibits a high degree of heat dissipation.

These objects and others which will become apparent hereinafter are attained in accordance with the present invention by a method including the following steps: preparing a formed body, especially of frame-like configuration, which is made e.g. of ceramics, glass, glass-ceramics or silicon carbide, and has first passageways in form of bores and/or indentations, placing the formed body in a mold and pouring a liquid metal in the mold to surround the formed body and thereby filling the first passageways, and removing metal from the formed body to leave metal only in the first passageways.

The formed body may be cast in the mold with molten metal, e.g. by a die casting process, with or without further structural elements that may be made e.g. of metal, and/or ceramics, and/or diamond, and/or a composite such as metal-matrix composite (MMC) material, cermet (metal-ceramic composite), hard metal or the like, and/or a reinforcement for MMC material, in order to form an integral unit and to fill the bores and/or indentations with metal. After the casting process, the metal layer is removed from the surface of the formed body to leave cast metal only in the bores and/or indentations.

In this manner, all required contacts can be provided in the formed body, without necessitating a separate production of each individual contact. If the formed body is of plate-like configuration, a cavity is suitably cut in at least one side of the formed body to create a casing with one open end, with the thus-shaped perimeter wall accommodating the first passageways. In the event, the formed body is based on a frame-like configuration (e.g. four-sided structure), there is no need to cut a cavity so that it is necessary to only remove the metal layer in a manner as described above. The attachment of additional structural elements to the formed body is advantageous because the thermal conductivity can be positively influenced, or insulated zones can be provided.

In the event, the formed body is of electrically insulated properties, the cavity or the frame-like configuration is shaped after the casting process in such a manner that an insulated, island-like elevation is formed at a distance the remainder of the formed body. Thus, e.g. an electronic circuit or electronic components can be placed upon this elevation without any insulation problems.

According to another feature of the present invention, the formed body may be provided with a recess for receiving a further structural element made of metal or diamond which extends flush with the surface of the formed body, with a second structural element made of MMC material or diamond being attached to this surface of the formed body and then subjected to the casting process. After conclusion of the casting process, the cavity is cut out of the formed body in such a manner that the first structural element of metal or diamond is at least partially exposed while retaining a connection with the second structural element of MMC material or diamond. Thus, a metal or diamond component is enclosed in the formed body by the MMC or diamond component and connected therewith through casting, and subsequently is made accessible again for use. Advantageously, the first structural element is made of silicon to allow placement of an electronic semiconductor component or of an electronic switching circuit.

According to another feature of the present invention, the formed body may be shaped after the casting process to exhibit at least one shoulder that extends transversely through the bores and/or indentations along a marginal side of the formed body. As a result, flat contacts are created which can be used in a very easy manner and with slight transition resistance for further connections.

In accordance with another feature of the present invention, the formed body may be provided on its surface with continuous second indentations which may terminate in the first passageways or extend through the passageways and which are filled with metal during the casting process. After being cast, the metal is removed at least from parts of the surface of the formed body to leave metal only in first passageways and in the second indentations. As a result, the casing is formed with electrically conducting connections between the metal-filled bores and/or indentations of the first passageways in a single process step.

According to another feature of the present invention, at least one side of the formed body may be provided with a projection. Thus, parts of the metallic surface layer may be left untreated to serve as conducting surfaces.

The further structural elements being attached to the formed body may be made of ceramic and/or diamond and/or a reinforcement for a MMC material e.g. an oxide ceramics, carbide ceramics or nitride ceramics, and/or fibrous materials or the like, and are placed together with the formed body in the mold to form an integral unit after being cast with metal and to form during the casting process at least partially a MMC composite material. As a result, the thermal conductivity of the casing is significantly improved in a simple manner and by way of a single process step. Suitably, a further structural element may serve as cover plate that terminates one side of the formed body. Thus, a casing can be made from a formed body which has one side provided with a cover plate that can have different physical properties, such as e.g. with regard to thermal conductivity, and can be made in a single process step for attachment to the frame-like formed body.

The ceramics may be based on oxides, titanates, nitrides, carbides, borides, silicones, or mixtures thereof. Ceramics of this type exhibit a particular high electrical insulation and are able to withstand prevailing high temperatures during casting process. Other ceramics may include aluminum oxide, aluminum nitride, or silicon carbide.

Metal used in the casting process may be based on pure metal or metal alloys to allow execution of the casting process in a very precise and reproducible manner. Of particular advantage for use as metal is iron, nickel, cobalt, aluminum, copper, titanium, magnesium, silver, gold, silicon, or alloys thereof.

The removal of metal after the casting process from surfaces of the formed body is executed e.g. through mechanical processes, in particular machining, etching, laser-beam machining, ultrasonic machining, wire-EDM, or cavity sinking by EDM. These methods can be used advantageously depending on the application. A mechanical method does not require any significant technological preparations while etching is especially suitable for production on a large scale. The use of laser-beam machining allows a very precise and effective removal of very small areas.

Preferably, the formed body is provided with beveled or slanted surfaces at the junction to the projection to facilitate the removal of metal, especially when focusing a narrow laser beam on the workpiece, as right angles are omitted which are difficult to reach by a laser beam.

According to another object of the present invention, the formed body may be formed along its shoulder with steps for formation of insulating surfaces after removal of the metal. As a result, a separation of different conducting areas is attained in a simple manner.

According to another feature of the present invention, a casing lid is connected, e.g. through welding or soldering or the like process, to the surface of the formed body that is left with a metal layer after the casting process. In this manner, the casing can be hermetically closed off.

In accordance with another embodiment of the present invention, the formed body may be made of metal, e.g. aluminum, copper, molybdenum, Kovar®, nickel-iron alloys or the like, and exhibits a same or similar thermal expansion coefficient as the material of the structural element that forms a termination on one side of the casing. As a result, the entire casing exhibits a superior heat conductivity and is thus in particular suitable for receiving components or switching circuits which are characterized by a strong heat generation. Suitably, the first passageways comprised of bores and/or indentations are electrically insulated from the metallic formed body by an insulating layer in form of a hollow cylinder preferably made of ceramics and suitably disposed in the bores and/or indentations. The placement of such insulating cylinders is necessary to effect the required insulation of the individual metal-filled first passageways from each other.

It may also be advantageous to utilize metal pins that partially project into the bores and/or indentations and are secured therein by casting. These metal pins may directly form terminals when using the casing as part of a printed circuit board, or they may be utilized as plug or socket to allow detachable securement of further conductors. Suitably, the metal pins are insulated at least partially by an insulator which projects at least partially into the bore and/or indentation. This enables to fill out the entire space between the pins and the electrically conducting formed body by insulating material to effect a superior insulation action.

A casing for receiving electronic components or electronic switching circuit, is based on a formed body of plate-shaped or frame-like configuration, and is made of ceramics, glass, glass-ceramics, metal or silicone carbide with or without further structural elements, e.g. of metal and/or ceramics and/or diamond and/or a composite such as e.g. metal matrix composite (MMC) material, cermet, hard metal or the like, and/or a reinforcement for MMC material, whereby the formed body includes first passageways in form of bores and/or indentations which are filled with metal through a casting process. The casing thus contains all required contacts without requiring to produce each individual contact separate from each other. By combining the formed body with additional structural elements during the casting process, especially the thermal conductivity can be positively influenced or insulated areas may be provided.

Preferably, the interior of the casing is formed with an elevation for placement of electronic components or switching circuits, with the required insulation being effected already during production of the casing. The elevation may be formed by a structural element of metal or diamond which is cast on to a plate-like further structural element that may be made of MMC material and/or diamond and/or ceramics and/or fibrous material with the formed body. Thus, physical properties, e.g. heat conductivity, of the elevation can be suited to demands independently from the remainder of the casing. Examples for the metal of the elevation-defining structural element include a semiconductor such as silicon. Thus, this structural element may be provided as a base for placement of an electronic semiconductor component or an electronic circuit.

It may further be provided to form along the outside of the formed body along its periphery a stepped projection which extends partially transversely to the preferably cylindrical bores and/or indentations of the first passageways, thereby creating flat contacts which can easily be utilized for further connection at low transition resistance.

According to another variation of the present invention, the surface of the formed body may incorporate continuous indentations that terminate in the first passageways or traverse the first passageways and are filled with metal during the casting process. Thus, the metal-filled first passageways become electrically connected by a single process step.

According to another feature of the present invention, the formed body is provided on one side with a jutting projection. The provision of such a projection may be advantageous for simplifying the manufacture of the casing because conducting and insulating surfaces can be creating as a result of metal removal.

The ceramics may be based on oxides, titanates, nitrides, carbides, borides, silicones, or mixtures thereof. Ceramics of this type results in a high thermal conductivity of the finished casing. Other ceramics may be based on aluminum oxide, aluminum nitride, or silicon carbide.

Metal used in the casting process may be based on pure metal or metal alloys, preferably metal on the basis of iron, nickel, cobalt, aluminum, copper, titanium, magnesium, silver, gold, silicone or alloys thereof.

Preferably, the formed body is provided with beveled surfaces at the junction to the projection to prevent the formation of undesired right angles. The formed body may also be provided with steps of insulating material to separate in a simple manner different conducting areas of the casing.

According to another feature of the present invention, a casing lid is connected, e.g. through welding or soldering or the like process, to the surface of the formed body that is left with a metal layer after the casting process. In this manner, the casing can be hermetically closed off in a simple and safe manner.

The formed body may also be made of metal, e.g. aluminum, copper, molybdenum, Kovar®, nickel-iron alloys or the like, and exhibit a same or similar thermal expansion coefficient as the material of the structural element that forms a termination on one side of the casing. This results in a superior heat conductivity which is in particular suitable for use with components or switching circuits which are characterized by a strong heat generation.

As a variation, it is possible to form the first passageways of bores and/or indentations by hollow insulating cylinders, preferably made of ceramics and suitably insulated from the metallic formed body, to thereby effect the required insulation between the contacts and the casing.

It may also be advantageous to utilize metal pins that partially project into the bores and/or indentations and are secured therein by casting. These metal pins may directly form terminals when using the casing as part of a printed circuit board, or they may be utilized as plug or socket to allow detachable securement of further conductors. Suitably, the metal pins are insulated at least partially by an insulator which projects at least partially into the bore and/or indentation. This enables to fill out the entire space between the pins and the electrically conducting formed body by insulating material to effect a superior insulation action.

BRIEF DESCRIPTION OF THE DRAWING

The above and other objects, features and advantages of the present invention will now be described in more detail with reference to the accompanying drawing in which:

FIG. 1 is a schematic, simplified perspective illustration of one embodiment of a casing according to the present invention:

FIG. 2a is a top view of the casing according to FIG. 1;

FIG. 2b is a sectional view of the casing taken along the line II—II in FIG. 2a;

FIG. 3a is a top view of a formed body used as starting article for making a casing according to the present invention;

FIG. 3b is a side view of the formed body of FIG. 3a;

FIG. 4a is a fragmented detailed illustration of a frame-like formed body provided with additional indentations;

FIG. 4b is a top view of the formed body according to FIG. 4a;

FIGS. 13a–13f show by way of schematic, fragmented sectional side and perspective views the final three process steps of making a casing according to the present invention on the basis of a formed body of metallic material;

FIGS. 14a–14f show by way of schematic, fragmented sectional side and perspective views a variation of the final three process steps of making a casing according to the present invention on the basis of a formed body of metallic material.

DETAILED DESCRIPTION OF PREFERRED EMBODIMENTS

Figure 5:
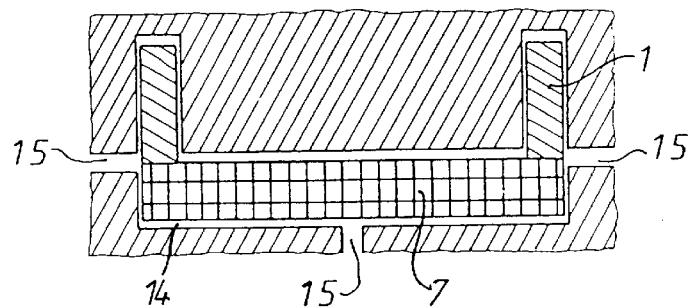
FIG. 5 is a schematic illustration of an exemplified mold for making a casing according to the present invention.

Turning now to the drawing, and in particular to FIG. 1, there is shown a simplified, schematic perspective view of one embodiment of a casing which has at least one open end and is formed with electrically conducting passages and connections for use with electronic components or switching circuits. Such casings are generally used in integrated printed circuit boards.

The casing is comprised of a formed body 1 exhibiting a frame-like configuration and made e.g. of ceramics, glass, glass-ceramics or silicon carbide. Along two opposing side walls 8, the formed body 1 is provided with passageways in form of a plurality of neighboring bores 3, as shown in particular in FIGS. 1 and 2b. The provision of bores 3 is done by way of example only, and it will be understood that the bores 3 may be supplemented or substituted by indentations 4, as shown in FIGS. 3a and 3b. Attached to one end of the formed body 1 is a structural element 7, for example of metal, and/or ceramics, and/or diamond, and/or a composite such as metal matrix composite (MMC) material, cermet, hard alloy or the like, and/or a reinforcement for a MMC material, to close the formed body on one end. The formed body 1 together with the structural element 7 is then placed in a mold, generally designated by reference numeral 9 and shown in FIG. 5 by way of example, to create an integral unit by pouring a molten metal, e.g. pure metal or metal alloy, into the mold 9 to surround the formed body 1 and the structural element 7. Suitably, this process is effected by a die casting process in which the liquid metal is forced under pressure into the mold 9 via channels 15.

FIG. 5 shows in more detail the mold 9 for casting the formed body 1 with metal, whereby the formed body 1 is configured as frame and placed together with the structural element 7 in the mold 9. Metal is introduced via the channels 15 into the cavity 14 of the mold 9 to surround the formed body 1 and the structural element 7 with metal. The passageways in form of bores 3 and/or indentations 4 are filled with metal, and the formed body 1 together with the structural element 7 is enveloped by the metal. After the casting process, the metal is removed from the surface of the formed body 1 in such a manner that cast metal remains only in the bores 3 and/or indentations 4. Thus, the electric connections formed during the casting process remain intact, and through precise placement of the bores 3 and the indentations 4, the desired contacts are created through the frame and along its surface, with the contacts being separated by insulation zones.

FIGS. 1 and 2b show the bores 3 filled with metal to form a casing in accordance with the present invention for receiving electronic components or electronic circuits. The casing is thus provided with electrically conducting passages through the casing walls 8 and is based upon a formed body 1, in particular of frame-like configuration, which is made of ceramics, glass, glass-ceramics, metal or silicon carbide, with or without the further structural element 7 that is made preferably of metal, and/or ceramics, and/or diamond, and/or a composite material, such as e.g. metal matrix composite material, cermet, hard metal or the like, and/or a reinforcement for a MMC material, with the passages and connections being formed by bores 3 and/or indentations 4 which are filled with metal through a suitable casting process. These passageways (bores 3 and/or indentations 4) form electrical conductors from the interior of the frame-like formed body 1, which is very advantageous for casings of this type because different types of connections e.g. of an integrated circuit accommodated within the interior of the formed body 1 can be insulated from each other and directed outside from thus-formed casing.

FIGS. 2a and 2b show the casing by way of a top view and a sectional view along the line II—II in FIG. 2a for additional illustration, with the metal-filled bores 3 being depicted in particular in FIG. 2b.

The structural component 7 serves as cover plate and is made of a metal matrix composite that is formed during the casting process. The cover plate 7 is made of a suitable matrix which is infiltrated during casting with metal to form at least partially a metal matrix composite. Examples of the material for the cover plate 7 include ceramics, and/or a reinforcement for a MMC material, e.g. an oxide ceramics, carbide ceramics, or nitride ceramics, and/or fibrous materials. The cover plate 7 may however also be made partially of other materials such as metal or diamond. The composite created thereby exhibits superior heat conductivity and thus is in particular suitable when being incorporated in a casing for an integrated circuit or for an electronic switching element that produces heat where heat dissipation is crucial for suitability of such a casing.

Figure 7:
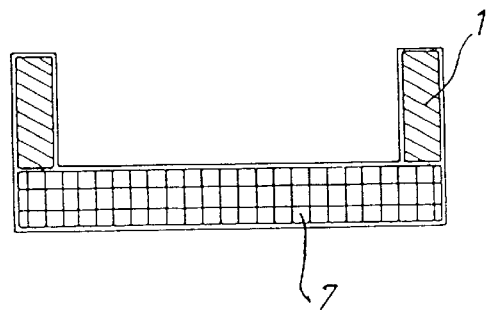
FIG. 7 is a sectional view of another embodiment of a casing according to the present invention.

FIG. 7 shows a simplified schematic illustration of the casing 1 together with cover plate 7 as produced by casting in the mold 9 shown in FIG. 5. The cover plate 7 may also be based on a prefabricated MMC material for use in the casting process which is combined with a reinforcing material such as e.g. oxide ceramics, carbide ceramics, or nitride ceramics, e.g. silicon carbide, aluminum nitride, beryllium oxide, aluminum oxide or boron nitride or carbon, and an infiltration metal of aluminum, iron, nickel, cobalt, silicon, copper, molybdenum or alloys thereof. Also applicable as MMC composite is a component of silicon carbide which is soaked with silicon metal. The structural element 7 may however also be made solely or partially of metal, diamond or other ceramics. As a result of the casting process, the formed body 1 and the cover plate 7 are securely joined together.

As stated previously, FIG. 3 shows a frame-type formed body 1 in which the bores 3 are substituted by indentations 4 that are open on one end. As a result of such indentations 4, not only a contacting through the formed body 1 after removal of the cast metal is retained but also a metallic conducting surface that extends on the top side of the frame is created for use as further contacts.

FIGS. 4a and 4b show fragmented views of a formed body 1 which is provided in its surface with continuous indentations 5 that terminate in the bores 3 or may traverse through the bores 3. During the casting process, the formed body 1 is surrounded with metal and the bores 3 and the further indentations 5 are filled with metal. Subsequently, the metal is removed from the surface of the formed body 1 to leave metal only in the bores 3 and the indentations 5 to effect a connection between two neighboring metal-filled bores 3. Certainly, the indentations 4 as shown in FIGS. 3a and 3b may be connected in a same manner by such indentations 5. Persons skilled in the art will understand that the connection between two bores 3 is only suitable when the formed body 1 is of electrically insulated material as otherwise a shorting would occur.

Figure 6:
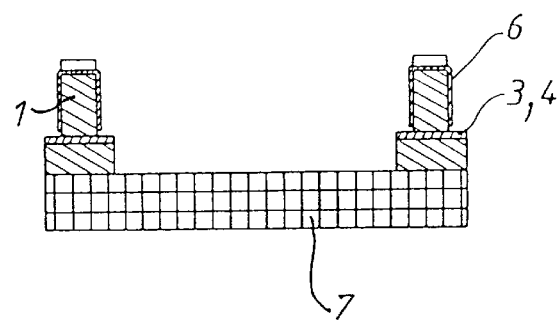
FIG. 6 is a sectional view of a casing according to the present invention.

Turning now to FIG. 6, there is shown a variation of a casing 1 according to the present invention which is provided with a projection 6 on both side walls 8. The formation of such a projection 6 enables to limit the metal removal for formation of insulating zones area as interruption to the bores 3 or indentations 4. This type of metal removal is in particular suitable through laser-beam machining. Although not shown in the drawings, it is also conceivable to provide bores through the projection 6 to form additional contacts. Persons skilled in the art will understand that although FIG. 6 shows the provision of two projections 6 on each side wall 8 of the casing 1, it is certainly conceivable to form such a jutting projection 6 on only one of the side walls 8 of the casing 1.

The insulating formed body 1 is made preferably of ceramics based on oxides, titanates, nitrides, carbides, borides, silicones or the like or mixtures thereof. Of particular resistance during the casting process and of particular insulating properties is a ceramics based on aluminum oxide, aluminum nitride or the like. However, persons skilled in the art will understand that any other suitable materials exhibiting insulating properties and temperature resistance may be used. Metal used for the casting process may be based on pure metal or on metal alloys. In particular advantageous are iron, nickel, cobalt, aluminum, copper, titanium, magnesium, silver, gold, silicon or alloys thereof.

The removal of metal from the formed body 1 may be effected through a mechanical operation, in particular machining, etching, laser-beam machining, ultrasonic machining, wire-EDM and cavity sinking by EDM. As a mechanical method, in particular milling should be mentioned as this machining process does not require complicated machinery for removing the metal layer from the surface of the formed body 1. Etching for removing metal may be suitable to produce casings on a large scale by accordingly suiting the cast metal and the etching agent.

Figure 8:
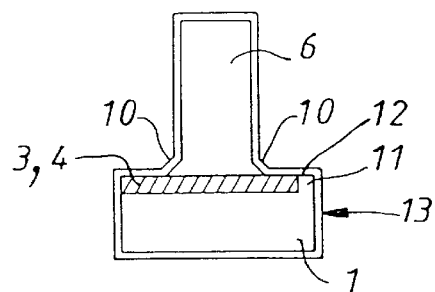
FIG. 8 is a partially sectional view of another embodiment of a casing according to the present invention.

When using a laser-beam machining to remove the metal layer, it is advantageous to provide the formed body 1 with a beveled or slanted surface 10 at the junction to the projection 6, as shown in particular in FIG. 8. As a result of these beveled surfaces 10, the cast metal can be removed completely in the corner areas. As further shown in FIG. 8, the casing 1 is provided with a step 11 to serve as an insulating horizontal surface 12 after the casting process and removal of the outer metal layer. Thus, it may not be necessary to remove metal from the vertical surface area 13 as the contact to the bores 3 or indentations 4 is interrupted, thereby preventing a shorting in this area. The provision of such a step 11 is however only suitable when using a formed body of electrically insulating material.

Although not shown in the drawings, it is certainly possible to tightly close the casing 1 by a casing lid which is secured, e.g. through welding or soldering, along a metal layer which is not removed after the casting process.

Figure 9A:
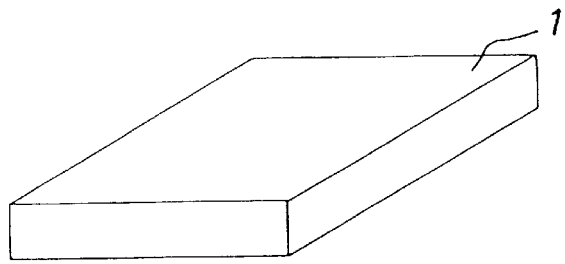
FIGS. 9a–9e are schematic, perspective illustrations of various process steps of making a casing according to the present invention.
Figure 9B:
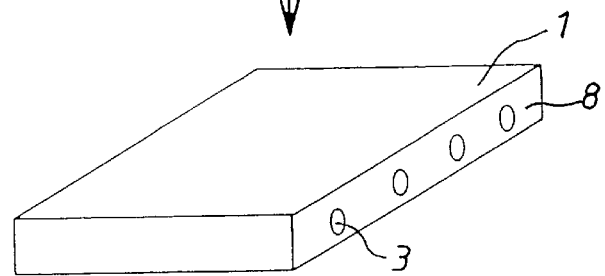
Figure 9C:
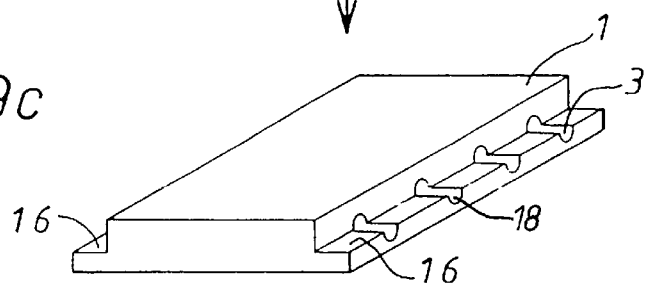
Figure 9D:
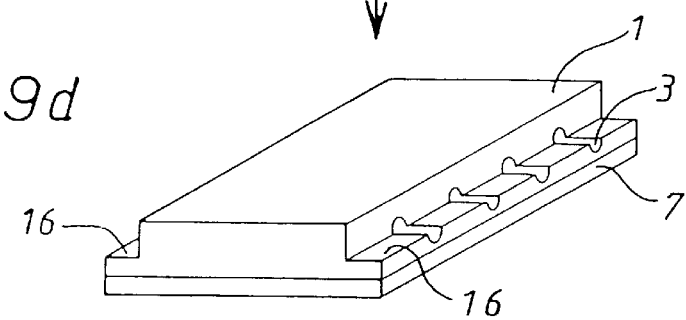
Figure 9E:
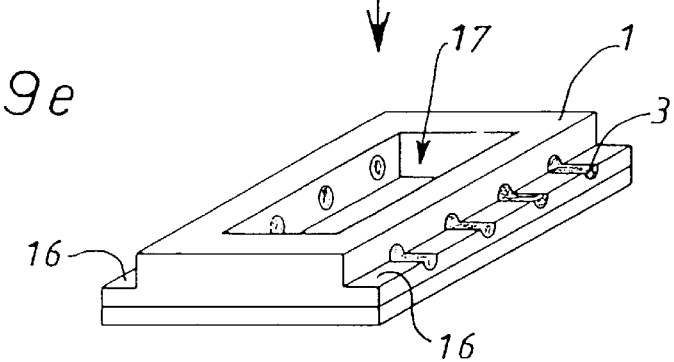

FIGS. 9a to 9e show successive process steps for making a casing in accordance with the present invention. As starting material, an insulating plate of generally rectangular configuration is used which is made of aluminum oxide (FIG. 9a). Drilled into the longitudinal side faces 8 of the plate 1 are bores 3, as shown in FIG. 9b, which may extend across the plate 1 or may also be only configured as blind bores. Persons skilled in the art, will understand that the bores 3 are described herein only by way of example and may certainly be substituted or supplemented by indentations 4 as previously described. Subsequently, as shown in FIG. 9c, a shoulder 16 is formed along the longitudinal side faces 8 and extends transversely to the bores 3. After formation of the shoulders 16, a preform in form of a cover plate 7 is placed to the underside of the plate 1, as shown in FIG. 9d. The cover plate 7 can be made of e.g. silicon particles or aluminum nitride particles. In the subsequent casting process, e.g. die casting process, the formed body 1 together with the cover plate 7 is placed in a mold and infiltrated under pressure e.g. with infiltration of aluminum to thereby form a MMC material composite. At the same time, the formed body 1 is secured upon the cover plate 7 by the liquid metal and the bores 3 as well as the cup-shaped impressions 18 on the shoulder 16 are filled with aluminum, and the entire assembly is enveloped by a thin layer of metal.

The formation of the casing is effected by removing the surface metal and by cutting out a hollow space 17 from the formed body 1 so that the casing is open on one end. Thus, the metal-filled bores 3 forming the contacts are accessible through the hollow space 17 to allow an electrically conducting connection to the outside of the casing, with the metal-filled cup-shaped impressions 18 on the shoulders 16 forming further contact areas. As a result, the contact surface being utilizable is increased.

Figure 10A:
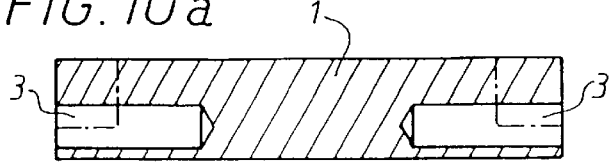
FIGS. 10a–10c schematically illustrate a variation of process steps of making a casing according to the present invention.
Figure 10B:
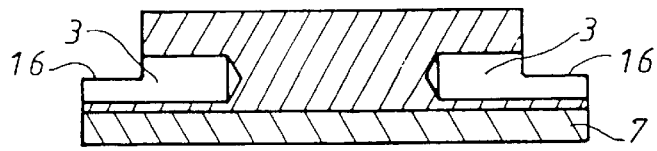
Figure 10C:
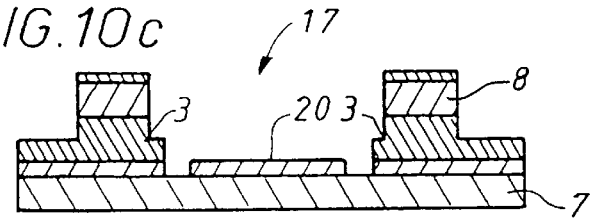

FIGS. 10a to 10c show sectional view of a variation of process steps to make a casing according to the present invention. The formed body 1 is provided with bores 3 and formed along the margins with shoulders 16 through removal of respective material from the formed body 1. After casting, the hollow space 17 is cut out in such a manner that an insulating, island-shaped elevation 20 is formed at a distance to the side walls 8 of the formed body 1. Thus, the elevation 20 may be used for attachment of an electrical component without encountering any insulation problems.

Figure 11A:
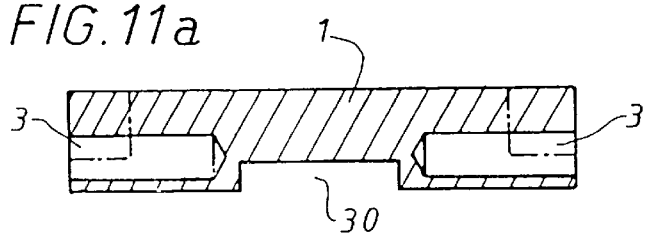
FIGS. 11a–11c schematically illustrate a further variation of process steps of making a casing according to the present invention.
Figure 11B:
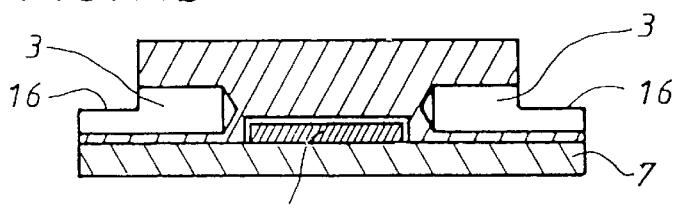
Figure 11C:
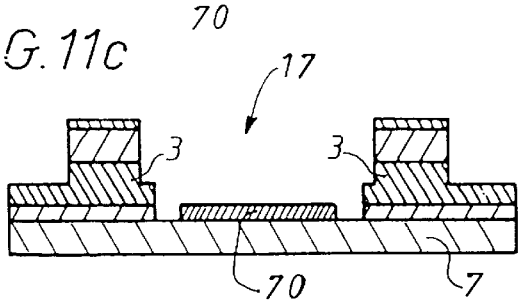

FIGS. 11a to 11c show another variation of process steps to make a casing according to the invention, which differs from the previous embodiment by the additional provision of a rectangular recess 30 at the underside of the formed body 1. Fitted in the recess 30 is a further structural element 70 made of metal or diamond in form of a plate which extends flush with the underside of the formed body 1. After placement of the structural element 70, the structural element 7 of diamond or MMC material, e.g. silicon or aluminum nitride particles, is secured across this side of the formed body 1 and then infiltrated in the subsequent die casting process by molten aluminum to form a MMC material. The solidifying metal secures the formed body 1 to the structural element 7 and the metal plate 70 is secured in the recess 30 by the structural element 7, while the bores 3 and the cup-shaped impressions 18 on the shoulders 16 are filled with metal, and the entire article is enveloped by a thin layer of metal.

After the casting process, the hollow space 17 is cut out so that only a metallic island-like elevation in form of the metal plate 70 is remains which is connected to the MMC component by the cast metal. This metal plate 70 serves a heat conducting purpose for the finished casing according to the invention. The plate 70 which may be made of metal or diamond is thus cast onto the plate 7 which is made of MMC material, and/or diamond, and/or ceramics, and/or fibrous material. The type of metal or metal alloy for use as the plate 70 is not restricted to any particular type. Any metal may be usable for this purpose. Preferred for use as material for plate 70 is a semiconductor material, e.g. silicon, as such a silicon plate may serve as basis for direct application of a semiconductor component or semiconductor circuit. The plate 70 may also have a laminated structure or may be made completely of ceramics or diamond.

Figure 12:
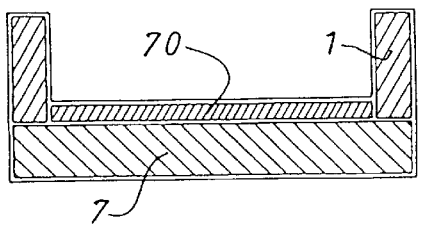
FIG. 12 is a sectional illustration of yet another embodiment of a casing according to the present invention.
Figure 15A:
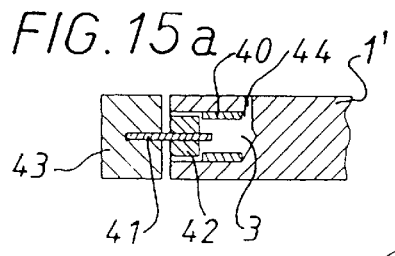
FIGS. 15a–15f show by way of schematic, fragmented sectional and perspective views a further variation of the final three process steps of making a casing according to the present invention on the basis of a formed body of metallic material.
Figure 15B:
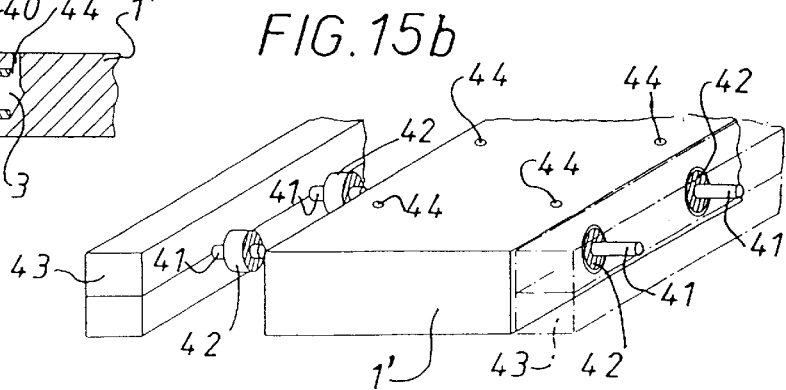
Figure 15C:
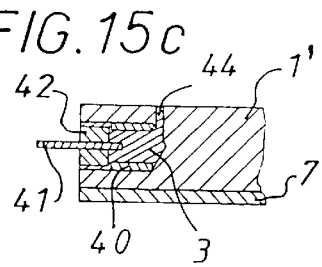
Figure 15D:
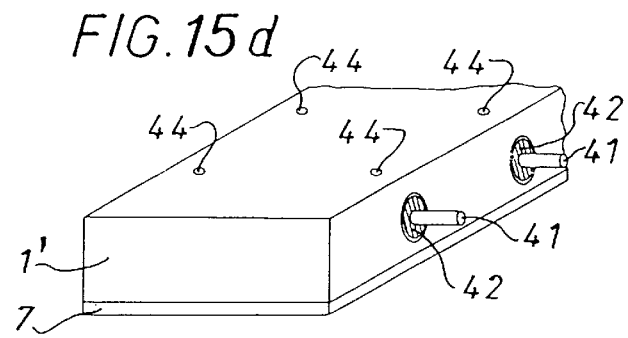
Figure 15E:
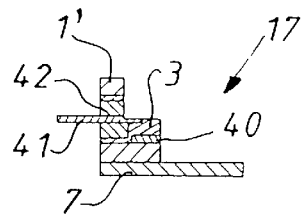
Figure 15F:
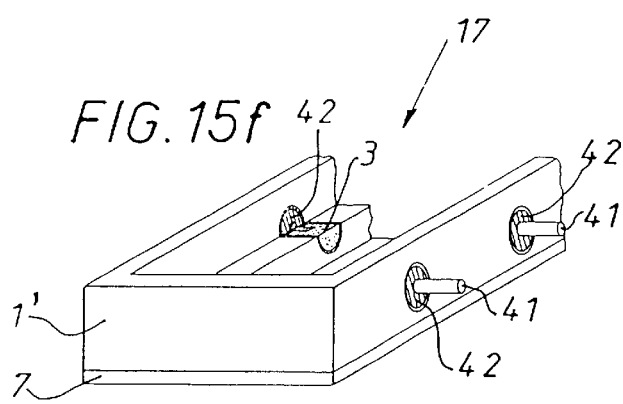

FIG. 12 illustrates a cross sectional view of a frame-like casing 1 together with cover plate 7 after being subject to the casting process, with plate 70 being arranged within the interior of the casing 1 in parallel relationship to the cover plate 7 and being entrapped during the casting process. For the casting process, the cover plate 7 may be formed by a prefabricated MMC material and reinforced with a material of e.g. oxide ceramics, carbide ceramics or nitride ceramics, e.g. silicon carbide, aluminum nitride, beryllium oxide, aluminum oxide, boron nitride or carbon, and infiltrated with a metal of aluminum, iron, nickel, cobalt, silicon, copper, molybdenum, or alloys thereof. The cover plate 7 may however also be made exclusively or partially of metal, of a different ceramics, or diamond. As a result of the casting process, the formed body 1 and the cover plate 7 are securely joined together and connected to the plate 70 which may be made of any suitable metal or metal alloy, preferably of a semiconductor material such as e.g. silicon.

FIG. 13a through 13f show a first variation of three final process steps for making a casing according to the present invention, with a formed body 1' being made of metal, e.g. aluminum, copper, molybdenum, cobalt, nickel-iron alloys or the like and exhibiting a same or similar thermal expansion coefficient as the material of the structural element 7. The thermal extension coefficients of the materials of the formed body 1' and the structural element 7 should be the same or similar as both are heated during the casting process with metal and thus expand thereby together. If the thermal expansion coefficients would differ, the subsequent cooling action of both components would result in tensions as they contract unevenly, thereby creating cracks in the surrounding metal. The formed body 1' which is made of metal and the structural element 7 have thus a same or similar heat expansion coefficient. The bores 3 and/or indentations 4 are electrically insulated from the formed body 1' by hollow insulating cylinders 40 that are preferably made of ceramics and suitably fitted in the bores 3.

FIG. 13a shows the metallic formed body 1' provided with blind bores 3 that are insulated from the formed body 1' by hollow insulating cylinders 40, as also shown in FIG. 13b. Attached to the underside of the formed body 1' is then the cover plate 7, as shown in FIGS. 13c and 13d. This combination of formed body 1' and plate 7 is then subjected to the casting process and thereby completely surrounded with metal which also fills the bores 3, as also shown in FIGS. 13c and 13d. Subsequently, the surface metal is removed, the hollow space 17 is cut out, and the shoulders 16 are formed along the margins of the formed body 1' as shown in FIGS. 13e and 13f. Certainly, the bores 3 may again be substituted or supplemented by indentations.

FIGS. 14a to 14f show a variation of the process according to the present invention which differs from the process steps of FIGS. 13a to 13f by the inclusion of metal pins 41 which project into the bores 3 and are cast therein. These metal pins 41 are retained in the blind bores 3 by a mounting 43 of e.g. graphite or the like. The bores 3 are again insulated from the formed body 1' by insulating cylinders 40, as shown in FIGS. 14a and 14b. Secured to the underside of the formed body 1' is the cover plate 7, as shown in FIGS. 14c and 14d, and subsequently this combination of formed body 1', metal pins 41 and plate 7 is subject to the casting process. The metal is able to penetrate the space between the mounting 43 and the formed body 1' and/or via special channels 44 that preferably extend from the top surface of the formed body 1' to the blind bores 3 to fill the bores 3. In the event the space between the mounting 43 and the formed body 1' is sufficient great to enable a penetration of the metal into the bores 3, the formation of channels 44 may also be omitted. A casing made in this manner thus includes metal pins 41 that jut outwards from the bores 3 (and/or indentations 4). Subsequently, as shown in FIGS. 14a and 14f, the surface metal is removed from the formed body 1' and the hollow space 17 is cut out. Certainly, it is also possible to substitute or supplement the bores 3 with indentations 4 on the surface of the formed body 1'.

FIGS. 15a to 15f show another variation of the process step to make a casing according to the present invention which differs from the previously described process steps by the incorporation of an insulating member 42 which partially surrounds the metal pins 41 and is received in the bore 3 for insulating the metal pins 41 from the bores 3. During casting process, metal permeates again through the space between the mounting 43 and the formed body 1' as well as through the space between the insulating members 42 and the inside wall surface of the bores 3 and/or via previously described particular channels 44 that lead to the bores 3. Under certain circumstances, the channels 44 may however also be omitted if the spaces are of sufficient dimensions. This type of process results in a casing in which the metal pins 41 are partly insulated by the insulating members 42 which are received in the bores 3 and/or indentations 4.

While the invention has been illustrated and described as embodied in a casing for receiving electronic components or switching circuits, and method of making such a casing, it is not intended to be limited to the details shown since various modifications and structural changes may be made without departing in any way from the spirit of the present invention.

What is claimed as new and desired to be protected by Letters Patent is set forth in the appended claims:

1. A process of making a casing having at least one open end and formed with means for electric conduction with electronic components or circuits; comprising the steps of:
    preparing a formed body with first passageways selected from the group consisting of bores and indentations;
    so placing the formed body together with at least one further structural element in a mold that the at least further structural element is disposed adjacent a surface of the formed body for effecting an improvement of a thermal conductivity of a finished casing;
    pouring a liquid metal in the mold to surround the formed body and the at least one further structural element, thereby filling the first passageways; and
    removing metal from the formed body to leave metal only in the first passageways.

2. The process of claim 1 wherein the formed body is of frame-like configuration.

3. The process of claim 1 wherein the formed body is made of a material selected from the group consisting of ceramics, glass, glass-ceramics and silicon carbide.

4. The process of claim 1 wherein the at least one further structural element is made of a material selected from the group consisting of metal, ceramics, diamond, a composite, and a reinforcement for a metal-matrix composite material (MMC).

5. The process of claim 4 wherein the composite is selected from the group consisting of metal-matrix composite material, cermet, and hard metal.

6. The process of claim 1 wherein the at least one further structural element is made of a material selected from the group consisting of ceramics, diamond, reinforcing material for a MMC material, and fibrous material to thereby provide the first structural element during said pouring step in form of a MMC composite material.

7. The process of claim 6 wherein the reinforcing material is selected from the group consisting of oxide ceramics, carbide ceramics and nitride ceramics.

8. The process of claim 1 wherein said pouring step is a die casting process.

9. The process of claim 1, and further comprising the step of providing the formed body of electrically insulating material with an isolated, island-like elevation.

10. The process of claim 1, and further comprising shaping the formed body with at least one shoulder extending transversely to the first passageways along a marginal side.

11. The process of claim 1 wherein said preparing step includes shaping the formed body in its surface with continuous second passageways in form of indentations that are connected to the first passageways, said pouring step filling also the second passageways with metal so that after said removing step metal is also left within the first and second passageways.

12. The process of claim 1 wherein said preparing step includes shaping the formed body with a projection on at least one side.

13. The process of claim 12 wherein said preparing step includes shaping the formed body with beveled surfaces at the junction to the projection to facilitate the removal of metal.

14. The process of claim 12 wherein said preparing step includes shaping the formed body with steps for exhibiting insulating surfaces after said removing step.

15. The process of claim 3 wherein the ceramics is based on a material selected from the group consisting of oxide, titanate, nitride, carbide, boride, silicon, mixtures thereof, aluminum oxide and aluminum nitride.

16. The process of claim 1 wherein the metal is selected from the group consisting of pure metal, metal alloys, iron, nickel, cobalt, aluminum, copper, titanium, magnesium, silver, gold, silicon and mixtures thereof.

17. The process of claim 1 wherein said removing step includes a process selected from the group consisting of machining, etching, laser-beam machining, ultrasonic machining, wire-EDM and cavity sinking by EDM.

18. The process of claim 1, and further comprising securing a casing lid onto a surface of the formed body that is left with a metal layer.

19. The process of claim 18 wherein said securing step includes a process selected from the group consisting of welding and soldering.

20. The process of claim 1, and further comprising the step of providing the formed body with a hollow space which has at least one open end, thereby exhibiting a peripheral wall for accommodating the passageways.

21. The process of claim 20, and further comprising the step of forming within the hollow space of the formed body of electrically insulating material with an isolated island-like elevation.

22. The process of claim 20 wherein said preparing step includes providing the formed body with a recess, inserting a first one of the further structural elements, made of a material selected from the group consisting of metal and diamond, within the recess and flush with a surface of the formed body, attaching a second one of the further structural elements, made of a material selected from the group consisting of MMC and diamond, onto the surface of the formed body, said removing step including at least partially exposing the first structural element in the hollow space while retaining a connection with the second structural element.

23. The process of claim 22 wherein the first structural element is made of a semiconductor material.

24. The process of claim 23 wherein the first structural element is made of silicon.

25. The process of claim 22 wherein the second structural element is a cover plate for closing one side of the formed body.

26. The process of claim 22 wherein the formed body is made of a metal selected from the group consisting of aluminum, copper, molybdenum, Kovar®, nickel-iron alloy, and exhibiting a same or similar thermal expansion coefficient as the material of the second structural element.

27. The process of claim 26 wherein said preparing step includes placing hollow-cylindrical insulating layers in the first passageways for electrically insulating the first passageways from the formed body.

28. The process of claim 26 wherein said preparing step includes projecting metal pins in the first passageways.

29. The process of claim 28 wherein said preparing step includes placement of a insulator at least partially in the first passageways for partially insulating the metal pins.

* * * * *